United States Patent [19]
Masuhara et al.

[11] 4,455,495
[45] Jun. 19, 1984

[54] PROGRAMMABLE SEMICONDUCTOR INTEGRATED CIRCUITRY INCLUDING A PROGRAMMING SEMICONDUCTOR ELEMENT

[75] Inventors: Toshiaki Masuhara, Hachioji; Osamu Minato, Kodaira; Katsuhiro Shimohigashi, Musashimurayama; Hiroo Masuda, Kodaira; Hideo Sunami, Tokyo; Yoshio Sakai, Hachioji; Yoshiaki Kamigaki, Tokyo; Eiji Takeda, Koganei; Yoshimune Hagiwara, Kodaira, all of Japan

[73] Assignee: Hitachi, Ltd., Tokyo, Japan

[21] Appl. No.: 192,869

[22] Filed: Oct. 1, 1980

[30] Foreign Application Priority Data

Oct. 1, 1979 [JP] Japan .............................. 54-125404
Oct. 19, 1979 [JP] Japan .............................. 54-134165

[51] Int. Cl.$^3$ ...................... H01L 27/04; H01L 29/04
[52] U.S. Cl. ...................................... 307/44; 307/465; 357/41; 357/51; 365/96
[58] Field of Search ...................... 371/8; 365/96, 200; 357/41, 51, 59; 307/465, 304, 219, 441, 442, DIG. 1

[56] References Cited

U.S. PATENT DOCUMENTS

| | | | |
|---|---|---|---|
| 3,664,896 | 5/1972 | Duncan | 357/59 X |
| 3,699,646 | 10/1972 | Vadasz | 357/59 X |
| 3,792,319 | 2/1974 | Tsang | 357/59 X |
| 4,146,902 | 3/1979 | Tanimoto et al. | 357/41 X |
| 4,228,528 | 10/1980 | Cenker et al. | 307/441 X |
| 4,240,094 | 12/1980 | Mader | 307/465 X |

Primary Examiner—Stanley D. Miller
Assistant Examiner—David R. Hudspeth
Attorney, Agent, or Firm—Antonelli, Terry & Wands

[57] ABSTRACT

A programmable semiconductor integrated circuitry including a circuit programming element is disclosed. The circuit programming element can be activated in a short-circuit mode by the irradiation of a laser or electron beam or by ion implantation so that it is converted from its original nonconductive state into a conductive or conductable state, thereby providing electrical connection between circuits and/or circuit elements of the integrated circuitry for a desired circuit programming such as circuit creation, circuit conversion or circuit substitution.

37 Claims, 24 Drawing Figures

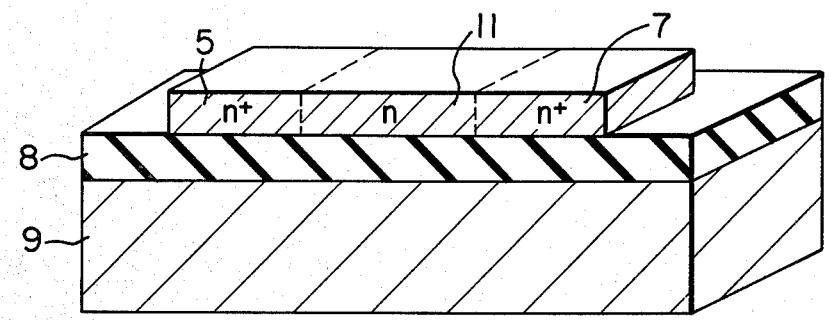
F I G. 2B
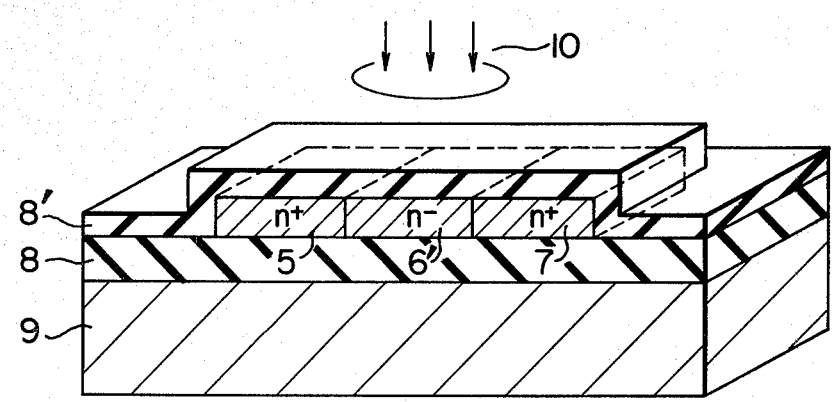
F I G. 2C
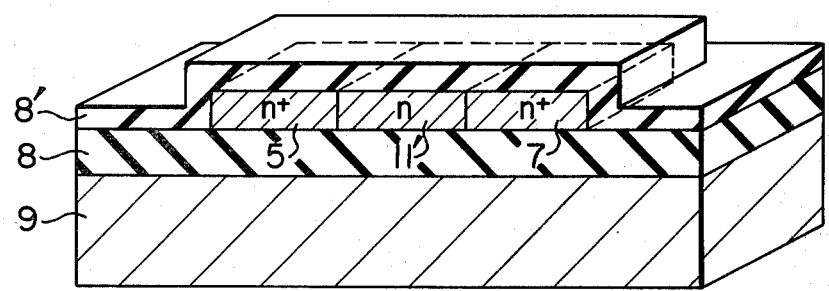
F I G. 2D

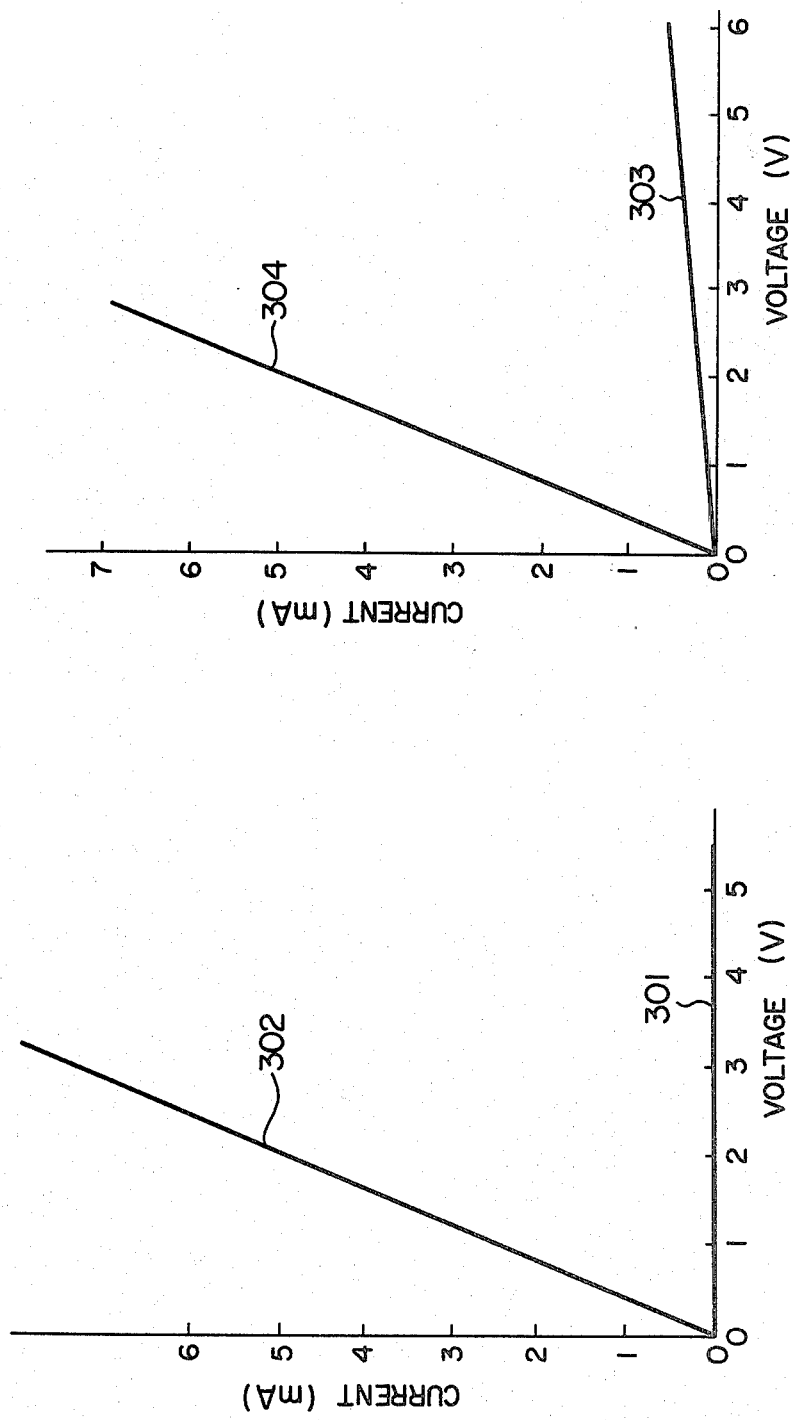

PROGRAMMABLE SEMICONDUCTOR INTEGRATED CIRCUITRY INCLUDING A PROGRAMMING SEMICONDUCTOR ELEMENT

BACKGROUND OF THE INVENTION

The present invention relates to semiconductor integrated circuitry in which such circuit programming as circuit creation, circuit conversion and circuit substitution is possible and the utilization thereof, and a circuit programming system and method of such of a programmable integrated circuitry. More particularly, semiconductor integrated circuitry according to the present invention has a programming element incorporated in the circuit interconnection, and a circuit programming system and method according to the present invention is effected by means of the programming element.

As is well known, circuit programming for a semiconductor chip including therein an integrated circuit is carried out by cutting open a part of the circuit interconnection.

Such circuit programming has hitherto been used in, for example, the programming of a read-only memory (ROM). In recent years, it has been utilized in substituting a small number of spare memory elements for defective elements. The conventional approach for cutting open the circuit interconnection usually includes (1) the fusing of a fuse element by a current or (2) the application of external optical energy (a pulse laser beam).

FIGS. 1A and 1B of the accompanying drawings illustrate a conventional circuit programming method in which a polycrystalline silicon layer or an Al layer 1 electrically isolated from a silicon substrate 3 by an SiO2 film 2 formed thereon, is irradiated with a laser beam 4 to cut open the layer 1. As one example of this method, R. P. Cenker et al., 1979 ISSCC Digest of Technical Papers have reported their experimental results in which the interconnection with respect to decoders of an MOS memory is changed so as to disconnect a decoder connected to a defective memory cell and to replace the defective cell by a non-defective memory cell connected to a spare decoder.

However, the above method in which an element is cut open, has the following drawbacks. (1) A laser beam of high energy is required so that the molten polycrystalline silicon or aluminum damages a part of the SiO2 film adjacent thereto or the laser beam is apt to impair the substrate. Accordingly, a semiconductor chip is required to have much room for layout, which results in large-area chip. (2) The use of only the cutting approach for circuit programming is sometimes disadvantageous from the standpoint of effective utilization of chip area.

SUMMARY OF THE INVENTION

An object of the present invention is to provide a structure of an integrated circuitry and the processing system and method thereof which permit the desired circuit programming with a small chip area and which neither lower the reliability of circuit elements nor injure the appearances thereof.

In order to attain the above object, the present invention basically employs a short mode. A desired function can be provided by using only the short mode. But, the degree of freedom for circuit interconnection change can be improved in the conventional cutting mode is used together with the short mode by means of the same system. More especially, a programming element used for the short mode employed in the present invention enables circuit programming by its conversion from an incomplete-connection element to a complete-connection element, i.e. its conversion from a nonconductive connection element into a conductive connection element or a conductable connection element (namely, an element which can become conductive).

BRIEF DESCRIPTION OF THE DRAWINGS

FIGS. 2A and 2B are perspective views showing an example of a resistor-type circuit programming element which is brought to the shorted state by the irradiation of a laser beam spot; in accordance with the present invention FIGS. 2C and 2D are perspective views showing another example of a resistor-type circuit programming element which is brought to the shorted state by the irradiation of a laser beam spot; in accordance with the present invention FIG. 3A is a graph showing a current-voltage characteristic of the element shown in FIGS. 2A and 2B;

FIG. 3B is a graph showing a current-voltage characteristic of the element shown in FIGS. 2C and 2D;

DESCRIPTION OF THE PREFERRED EMBODIMENTS

The present invention will now be explained in detail with reference to various embodiments.

Figure 1A:
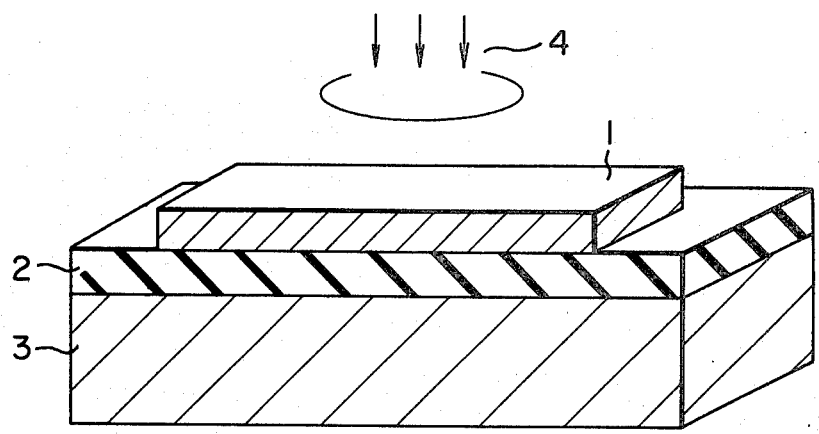
FIGS. 1A and 1B are perspective views for explaining a conventional cutting of the interconnection by the irradiation of a laser beam spot.
Figure 1B:
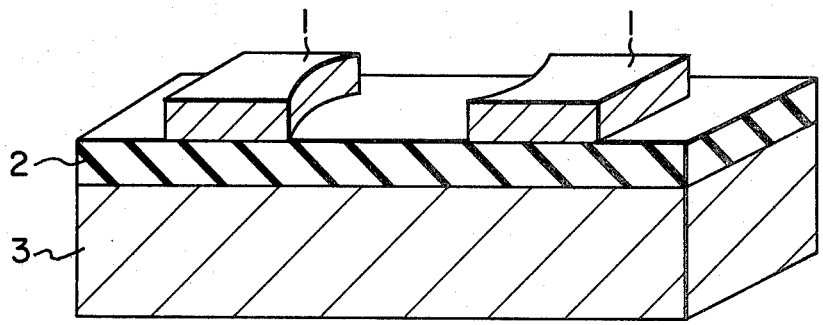
Figure 2A:
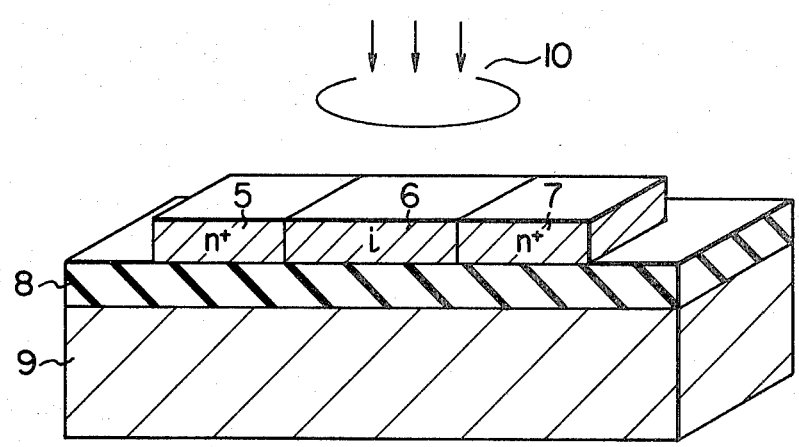

Referring to FIG. 2A, there is shown a circuit programming element in which two n+-type polycrystalline silicon (poly-Si) layers 5 and 7 isolated from an Si substrate 9 by an SiO2 layer 8 deposited thereon, are disposed opposite to each other with an intrinsic layer (i-layer) 6 interposed therebetween. The i-layer 6 is formed of a doped or undoped polycrystalline silicon layer which has a very high resistance (for example, a sheet resistivity of more than 100 KΩ/□). If this circuit programming element is irradiated with a laser or electron beam 10 to apply a sufficient amount of energy so as to diffuse impurities from the n+ type layers 5 and 7 into the i-layer 6, the high-resistance layer 6 is converted to a low-resistance layer 11, as shown in FIG. 2B. Thus, the n+-type layers 5 and 7 kept in a non-conductive state before the irradiation of the beam 10 (that is, the circuit programming element assuming the non-active state) are put in the conductive state after the irradiation of the beam 10 so that the circuit programming element is activated.

The conductivity type of each of the low-resistance layers 5 and 7 are shown as n+-type in FIGS. 2A and 2B may be p+-type.

The results of experiment made with respect to the circuit programming element shown in FIG. 2A will now be described. For the experiment an n+-i-n+ polysilicon layer structure was used in which a distance between the n+-type layers is about 3 μm, each layer has a width of 3 μm and the n+-type layer is doped with phosphorus or arsenic at a concentration of more than or equal to $10^{18}/cm^3$. The circuit programming element had a resistance of more than $10^{10}$ Ω before the irradiation of laser beam and could be therefore considered as an insulator. The element was irradiated for 200 nsec with the laser beam spot having a diameter of 7 μm and an energy of $5 \times 10^7$ W/cm$^2$ which decreased the resistance of the element to 500 Ω, as shown in FIG. 3A. In FIG. 3A, reference numeral 301 designates the current-voltage characteristic of the element (which shows a resistance of more than $10^{10}$ Ω) before the laser irradiation, and numeral 302 designates that after the laser irradiation (which corresponds to a resistance of 500 Ω). It is understood that the resistance of the circuit programming element before the laser irradiation is more than $10^6$ times as large as that after the laser irradiation, and the element can be considered as a conductor after the laser irradiation. The energy given to the element by the laser beam is less than one-hundredth of the energy required to cut an Al layer and less than one-tenth of the energy necessary to cut a polycrystalline silicon layer. The underlying Si substrate or SiO$_2$ layer and an SiO$_2$ or SiN layer (not shown) on the polycrystalline silicon layer were not impaired by the irradiation of the laser beam.

The modification of the circuit programming element shown in FIG. 2A is shown in FIG. 2C. Referring to FIG. 2C, there is shown a circuit programming element in which two n+-type polycrystalline silicon layers 5 and 7 formed on an SiO$_2$ layer 8 deposited on an Si substrate 9 are disposed opposite to each other through an n−-type layer 6' (which may be replaced by the i-layer 6 shown in FIG. 2A) formed of a polycrystalline silicon layer having a high resistance (for example, a sheet resistivity of more than 10 KΩ/□) but the n+-n−-n+ structure is coated with an insulating film 8' containing an impurity, for example, phosphorus. If this element is irradiated with a laser or electron beam 10 to apply a sufficient amount of energy so as to diffuse the n-type impurity from the insulating film 8' into the n−-type layer 6', the high-resistance layer 6' is converted into the low-resistance layer 11', as shown in FIG. 2D.

FIG. 3B shows the results of experiment made on the structure shown in FIG. 2C. In FIG. 3B, reference numeral 303 designates a current-voltage characteristic before the laser irradiation (which corresponds to a resistance of 10 KΩ), and numeral 304 designates that after the laser irradiation (which corresponds to a resistance of 500 Ω). That is, the resistance of the circuit programming element before the laser irradiation is 20 times as large as that after the laser irradiation. In this experiment, there was used an n+-n−-n+ polysilicon layer structure in which a distance between the n+-type layers is about 4 μm, each layer has a width of 3 μm and the n+-type layer is doped with phosphorus or arsenic at a concentration of more than or equal to $10^{18}/cm^3$. The insulating film 8' was formed of a phosphosilicate glass (PSG) film containing 1 to 4 mol percent of phosphorus. The element was irradiated for about 30 nsec with the laser beam spot having a diameter of 5 μm and an energy of about $10^8$ W/cm$^2$.

The insulating film 8' containing the n-type impurity is not required to cover the whole surface of the n+-n−-n+ structure, but only the n−-type layer 6' may be coated with the insulating film 8'. Also, the insulating layer 8' may be provided beneath the n+-n−-n+ structure or on side faces thereof. Further, a thin insulating film (for example, a 10 to 50 μm thick SiO$_2$ film) may be interposed between the insulating layer 8' and the high-resistance layer 6'.

Though not shown in FIG. 2C, the n+-type layer 5 or 7 is connected directly or through a metalization such as Al to a semiconductor element formed in the substrate 9 or to an interconnection provided on the SiO$_2$ layer 8. The same holds for the embodiment shown in FIG. 2A.

As is apparent from the above-mentioned experiments, the circuit programming elements shown in FIGS. 2A and 2C have the following advantages. (1) The resistance of the element is decreased through the laser irradiation by the order of, for example, more than $10^6$, and therefore an insulator or a high-resistance element can be converted into a conductor or a low-resistance element. (2) An inexpensive, low power laser source can be used since only a relatively small amount of energy is required. (3) The underlaying layer or substrate and the insulating passivation layer are not impaired by the laser irradiation.

Figure 4:
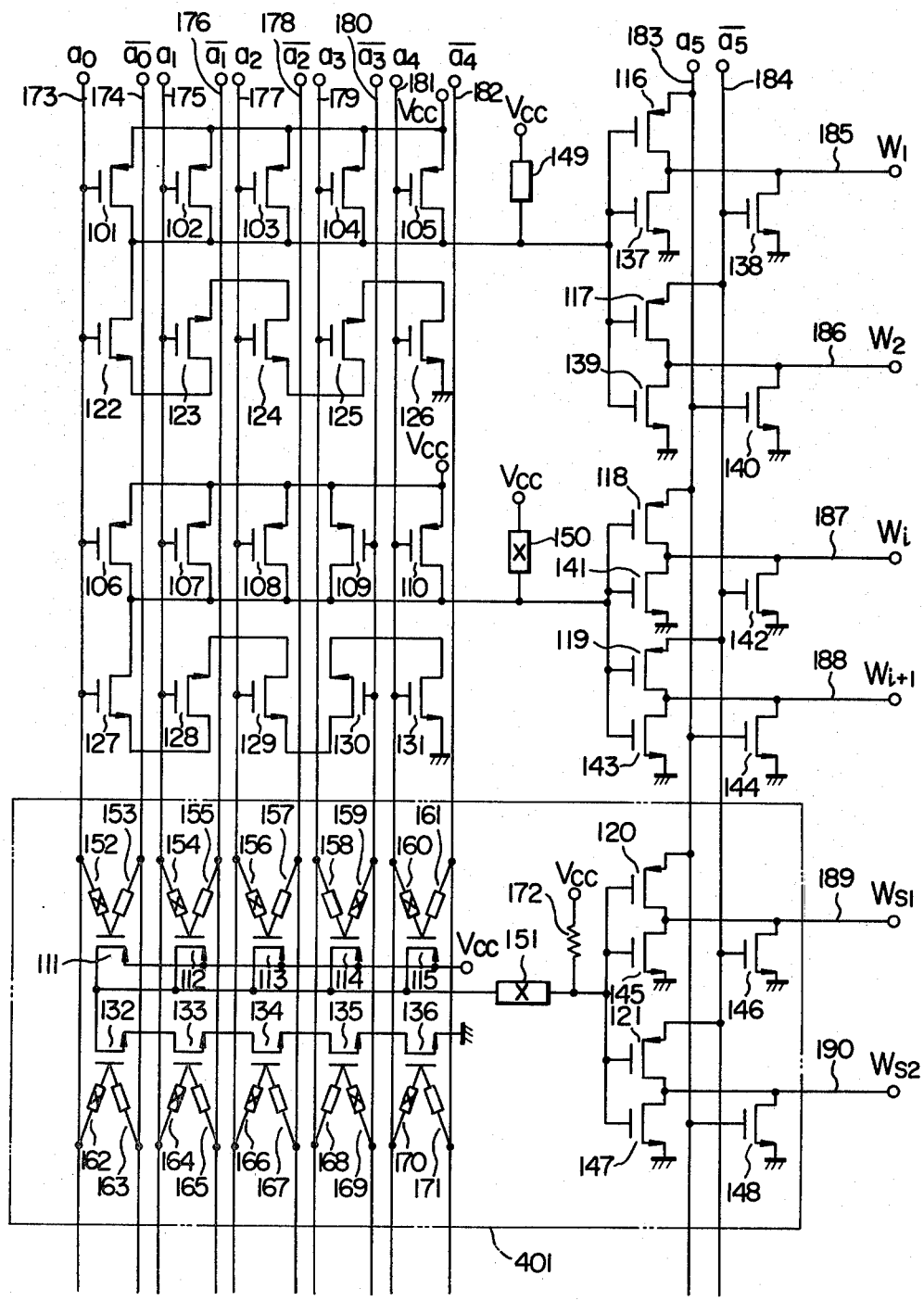
FIG. 4 is a circuit diagram showing a decoder circuit which includes circuit programming elements according to an embodiment of the present invention.

Next, explanation will be made of a semiconductor integrated circuit to which a circuit programming method according to the present invention is applicable. FIG. 4 shows a memory decoder in which defective bits can be replaced by selected ones of spare bits using such resistive elements as shown in FIG. 2A as the circuit programming element. In FIG. 4, reference numerals 101 to 121 designate P-channel type insulated-gate field effect transistors (MOS transistors), 122 to 148 N-channel type MOS transistors, and 149 to 171 polycrystalline silicon (poly-Si) layers of n+-i-n+ structure, which are irradiated with laser beams at positions indicated by marks X. Symbol $V_{cc}$ designates a supply voltage input terminal. In the shown memory decoder, one of a plurality of word lines 185, 186, 187, 188, and so on is selected in accordance with the high/low level information of address signals $a_0$ to $a_5$ and $\bar{a}_0$ to $\bar{a}_5$ on address lines 173 to 184 so that the selected word line is put in a high potential level. Since six address signals $a_0$ to $a_5$ are employed in this decoder, a desired word line can be picked out from among $2^6 (=64)$ word lines. For convenience of illustration, however, only four word lines 185 to 188 are shown in FIG. 4. Lines 189 and 190 are spare word lines connected to spare memory cells. The spare word lines 189 to 190 are kept in a low potential level when there is no faulty memory cell. When a faulty cell is found among memory cells connected to the word line 187 or 188, the n+-i-n+ structures labelled X are irradiated with laser beams. Then, the polysilicon layer 150 is short-circuited so that each of gates of the transistors 141 and 143 is applied with the supply voltage $V_{cc}$. As a result, the word lines 187 and 188 are never activated (that is, are kept in the low potential level). On the other hand, each of the polysilicon layers 151, 152, 154, 156, 159, 160, 162, 164, 166, 169 and 170 is short-circuited so that a spare decoder 401 is activated and exhibits the same circuit configuration as a regular decoder made up of the transistors 106 to 110, 127 to 131, 118, 119, and 141 to 144. Now, the word lines 189 and 190 are substituted for the word lines 187 and 188. A resistor 172 shown in FIG. 4 is used to keep the word lines 189 and 190 in the low potential level when the spare decoder 401 is not employed. The resistance of the resistor 172 may be made greater than the resistance of the series-connected transistors 132 to 136.

In the above manner, the substitution of spare bits for faulty bits can be readily carried out.

Figure 5:
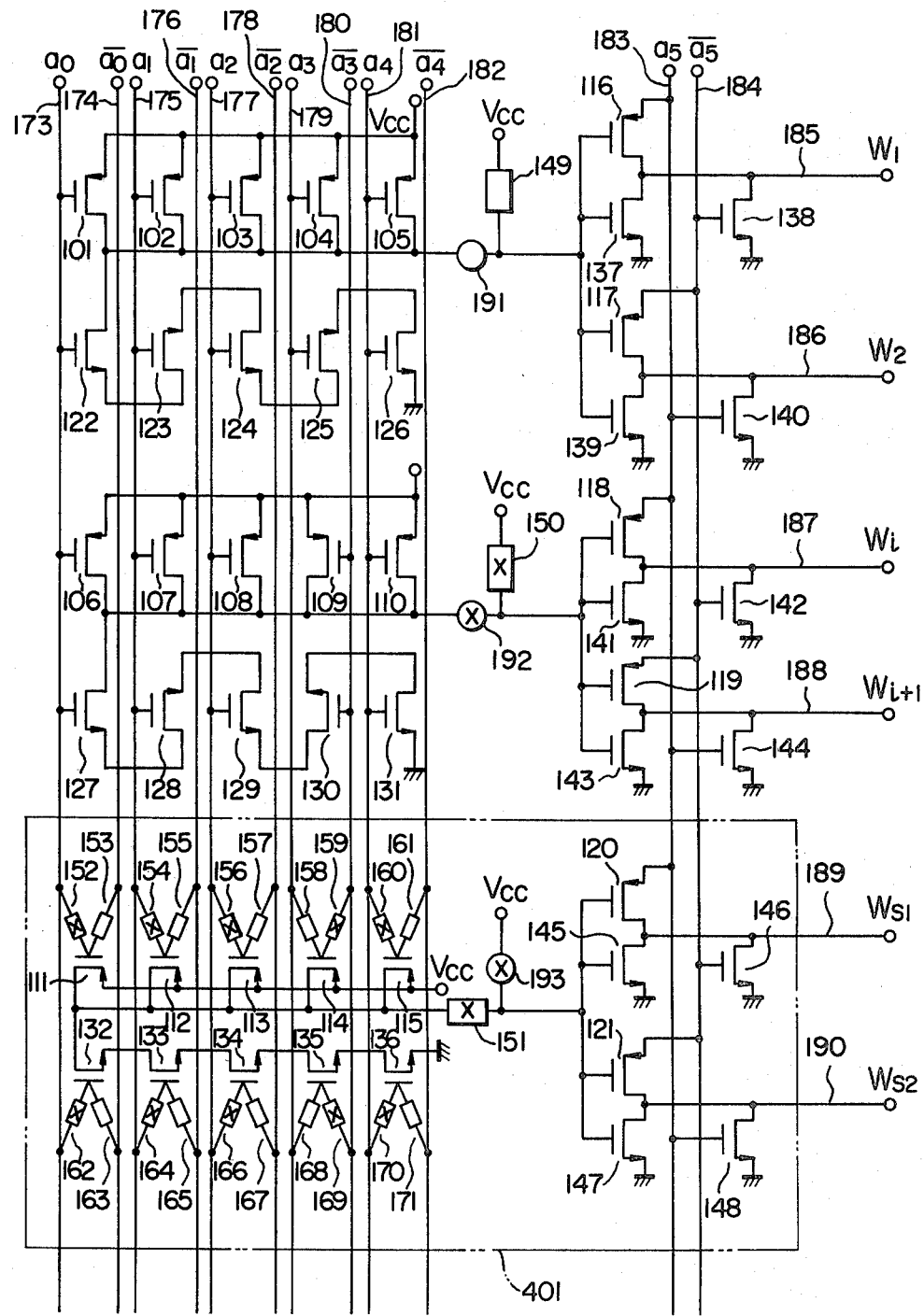
FIG. 5 is a circuit diagram showing a decoder circuit which includes circuit programming elements according to another embodiment of the present invention.

Though only the short mode has been employed in the above-mentioned embodiment, the cutting or disconnection mode can be employed by the use of a laser beam available from the same laser source but having a higher energy, thereby providing a modified interconnection for circuit programming. Such an example is shown in FIG. 5. In the figure, reference numerals 191, 192 and 193 designate n+-type polycrystalline silicon layers, among which the layers 192 and 193 indicated by marks X are cut open to permit a circuit programming similar to that in FIG. 4. Since the function of the decoder shown in FIG. 5 is basically the same as that of the decoder shown in FIG. 4, further description is omitted. In the modified embodiment shown in FIG. 5, the resistor 172 as shown in FIG. 4 can be omitted.

Figure 7:
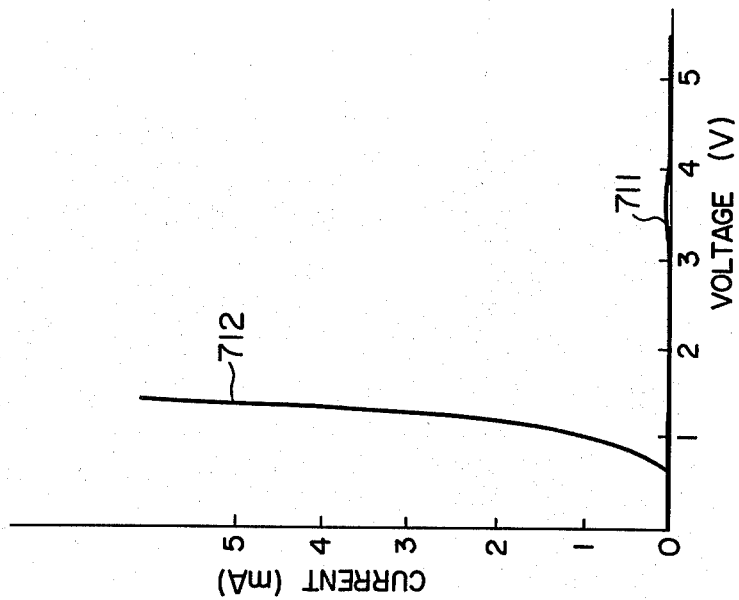
FIG. 7 is a graph showing a current-voltage characteristic of the element shown in FIGS. 6A and 6B.
Figure 6A:
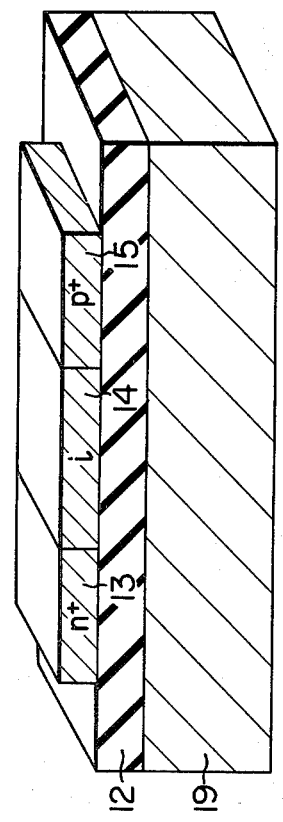
FIGS. 6A and 6B are perspective views showing an example of a circuit programming element which is converted into a pn junction diode by the irradiation of a laser beam spot.
Figure 6B:
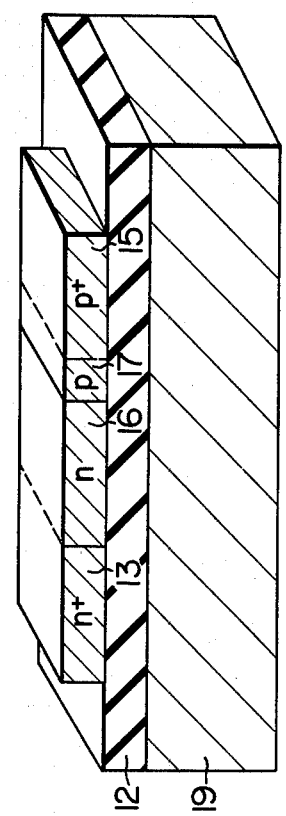

In the foregoing, there has been described the n+-i-n+ or p+-i-p+ polysilicon layer structure in which opposite side low-resistance layers are of the same conductivity type. However, a polysilicon layer structure including opposite side layers of different conductivity types, as shown in FIG. 6A may be employed. Referring to FIG. 6A, a polysilicon layer structure having opposite n+-type layer 13 and p+-type layer 15 with a high-resistance layer (i-layer) 14 interposed therebetween is formed on an $SiO_2$ layer 12 deposited on an Si substrate 9. When the polysilicon layer structure is irradiated with a laser beam 18 under the same condition as the case of FIG. 2B, impurities are diffused from the n+-type and p+-type layers (each of which has an impurity concentration of more than $10^{18}/cm^3$) into the i-layer to form therein, an n-type layer 16 and a p-type layer 17 with a pn junction therebetween, as shown in FIG. 6B. When there was an n+-i-p+ polysilicon layer structure in which a distance between the n+ and p+ layers is 3 $\mu$m and each layer has a width of 3 $\mu$m, the current-voltage characteristics as shown in FIG. 7 were exhibited. In FIG. 7, reference numeral 711 designates the current-voltage characteristic before the laser beam irradiation and numeral 712 designates that after the laser irradiation.

Figure 8A:
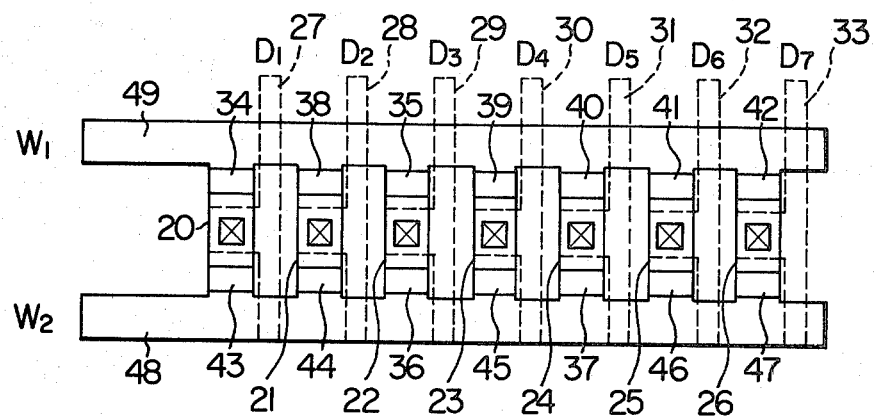
FIGS. 8A and 8B are a plan view and a circuit diagram showing a programmable logic array which includes circuit programming elements according to a further embodiment of the present invention.
Figure 8B:
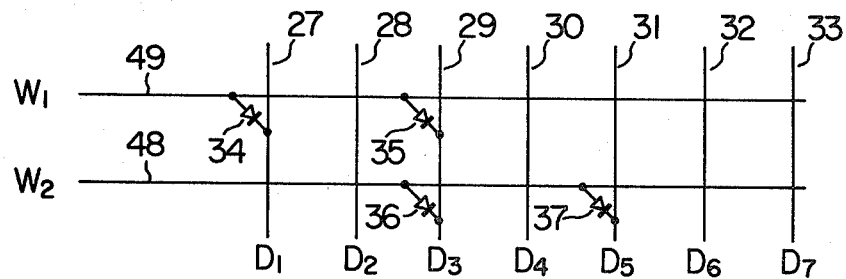

The above-mentioned formation of pn junction can be used for producing an optically writable read-only memory or a programmable logic array (PLA) whose plan view and circuit diagram are shown in FIGS. 8A and 8B, respectively. Referring to these figures, word lines 48 and 49 formed of p+-type polycrystalline silicon layers are connected to n+-type polycrystalline silicon layers 20 to 26 through i-layers 34 to 47. The n+-type layers 20 to 26 are connected through through-holes to data lines 27 to 33 (made of Al), respectively. When the i-layers 34 to 37 are irradiated with laser beams, diodes are formed, thereby providing a programmable logic array.

In the foregoing embodiments, the polysilicon layer has been used for the circuit programming element. However, it should be understood that the circuit programming element may be formed of a monocrystalline silicon layer or a semiconductor layer made of materials other than silicon.

As is apparent from the foregoing description, the following circuit programmings can be conducted using the resistor-type circuit programming elements shown in FIGS. 2A, 2C and 6A.

(1) A predetermined circuit connection is made by activating a resistor type circuit programming element or putting its high-resistance region in a low-resistance state through the irradiation of a laser beam spot, thereby completing a desired circuit.

(2) The circuit arrangement of a regular circuit is changed by means of the activation of a circuit programming element.

(3) A spare circuit is connected to a regular circuit by means of the activation of a circuit programming element.

(4) A defective part of a regular circuit is eliminated while a spare circuit is connected to the regular circuit to substitute the spare circuit for the defective part.

Next, examples of circuit programming elements of other types will be described.

For use the insulated-gate field effect transistors (MOS transistors), it has been proposed utilize offset gate electrode structures in order to reduce a parasitic capacitance produced due to an overlapping arrangement of a gate electrode and a drain or source region. The offset-gate electrode structure is shown in cross section in FIG. 9.

Figure 9:
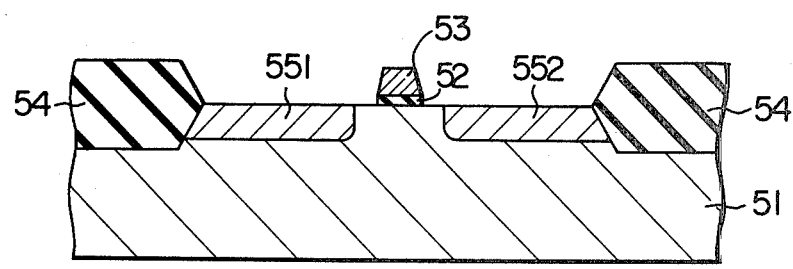
FIG. 9 is a sectional view showing an offset-gate electrode structure element.
Figure 10:
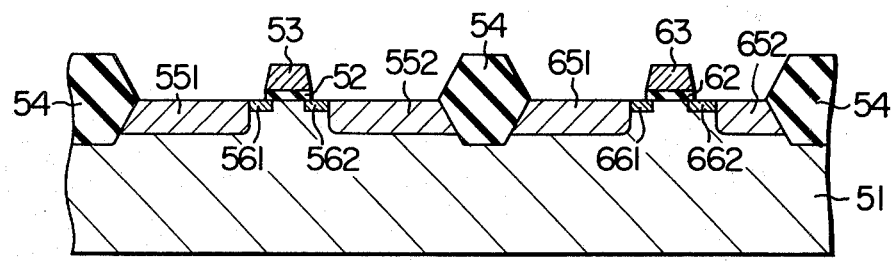
FIG. 10 is a sectional view showing an offset-gate type MOS transistor.

In FIG. 9, reference numeral 51 designates a semiconductor substrate of, for example, p-type Si, 52 a gate insulating film, 53 a gate electrode formed of a polycrystalline silicon film or the like, 54 an insulating film for isolation between circuit elements, and 551 and 552 source and drain regions formed of n+-type layers. As shown, the gate electrode 53 does not overlap on each of the source and drain regions 551 and 552. FIG. 10 shows an example of offset-gate type MOS transistors using such a structure as shown in FIG. 9. In FIG. 10, reference numeral 62 designates a gate insulating film, 63 a gate electrode, 651 a source region, 652 a drain region, and 561, 562, 661 and 662 weakly-doped, shallow, n-type layers formed in the surface of the semiconductor substrate 51. The n-type layers 561, 562, 661 and 662 are formed through ion-implantation process, using the gate electrodes 53 and 63 (each made of a polycrystalline silicon film) as the mask. Arsenic or phosphorus may be employed as the n-type impurity, with the dosage of $10^{11}$ to $10^{14}$ cm$^{-2}$ and the implantation depth of 0.1 $\mu$m to 0.5 $\mu$m. The resistivity of the p-type Si substrate 51 is selected within a range from 2 $\Omega$·cm to 20 $\Omega$·cm, and the source and drain regions 551, 552, 651 and 652 have an impurity concentration of more than $10^{20}$ cm$^{-3}$.

Figure 11:
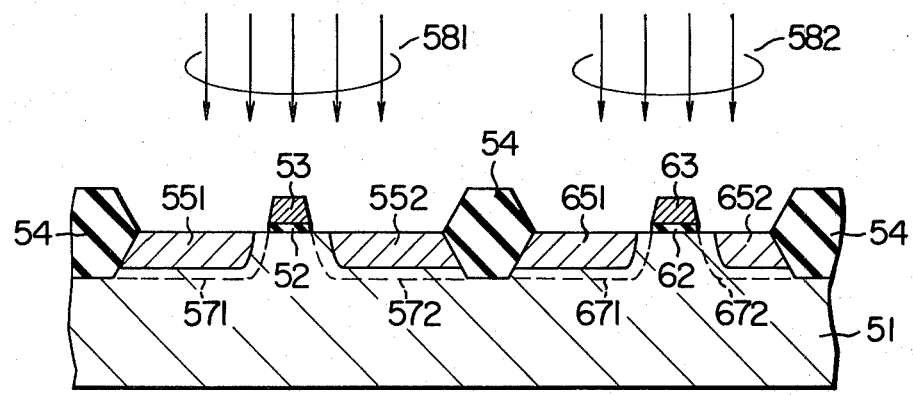
FIGS. 11 and 12 are sectional views for showing that an offset-gate electrode structure element is changed to an offset-gate type MOS transistor by the irradiation of a laser beam spot to be used as a circuit programming element.

The offset-gate type MOS transistor can be formed through the above-exemplified ion-implantation process. When the offset-gate electrode structure element shown in FIG. 9 is locally heated or irradiated with such an energy beam as a laser or electron beam, the source and drain regions 551 and 552 can be extended (or grown). In FIG. 11 showing MOS transistors thus formed, the source and drain regions 551, 552, 651 and 652 are extended by the irradiation of energy beams 581 and 582 so as to form regions 571, 572, 671 and 672, respectively.

Thus, it can be understood that a desired circuit programming of an integrated circuit is possible by employing the offset gate electrode structure element shown in FIG. 9 as a constituent element of the integrated circuit. More especially, when a main part or regular circuit portion of a semiconductor integrated circuit is made up of MOS transistors such as shown in FIG. 10 and offset-gate electrode structure elements such as shown in FIG. 9 are also provided in the same semiconductor integrated circuit, the following circuit programmings are possible.

(1) The offset-gate electrode structure element is activated (that is, the source and drain regions are extended to a channel beneath the gate electrode so that conduction is enabled between the source and drain by the application of a gate signal) by the irradiation of an energy beam, thereby providing a predetermined circuit connection to complete a desired circuit.

(2) The circuit arrangement of the regular circuit is changed by means of the activation of the offset-gate electrode structure element.

(3) A spare circuit is connected to the regular circuit by means of the activation of the offset-gate electrode structure element.

(4) A spare circuit is connected to the regular circuit by means of the activation of the offset-gate electrode structure element while a defective part of the regular circuit is eliminated, so that the spare circuit is substituted for the defective part.

It should be also understood that the circuit programming of any desired circuit is possible in such a manner that all of or the greater part of the MOS transistors in an integrated circuit are prepared with the offset-gate electrode structure elements shown in FIG. 9 and these elements are successively activated through the irradiation of energy beams to form a desired circuit.

Figure 12:
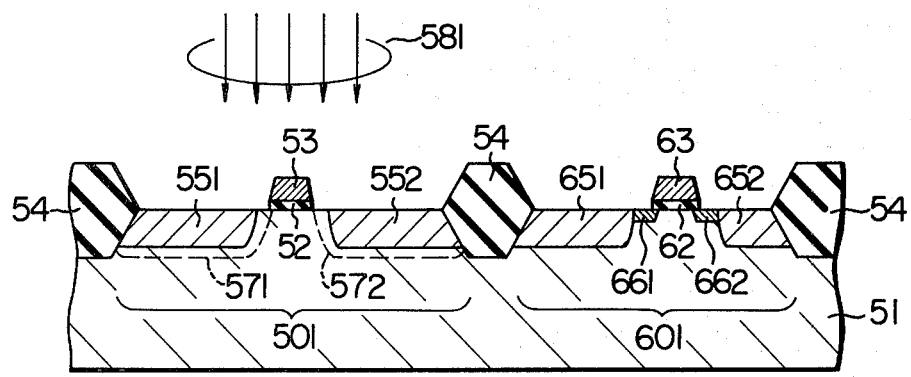

FIG. 12 shows an embodiment in which an offset-gate electrode structure element is employed as a circuit programming element. In the surface of a p-type silicon substrate 51 (having a resistivity of 10 Ω·cm) are provided an offset-gate type MOS transistor 601 making up a regular circuit portion and an offset-gate electrode structure element 501 serving as a circuit programming element. The MOS transistor 601 includes a gate insulating film 62 (for example, an SiO$_2$ film having a thickness of 50 nm), a gate electrode 63 (formed of an n-type polycrystalline silicon layer and having a sheet resistivity of 20 to 40 Ω/□, a gate length of 3 μm and a gate width of 15 μm), and source and drain regions 651 and 652 (formed of an n$^+$-type diffusion layer formed through thermal-diffusion or ion-implantation process and having an impurity concentration of $10^{21}$ cm$^{-3}$). Further, the circuit programming element 501 comprises a gate insulating film 52 (formed of the same layer as the gate insulating film 62), a gate electrode 53 (which is the same in material and size as the gate electrode 63), and source and drain regions 551 and 552 (formed in the same manner as the regions 651 and 652). Reference numeral 54 designates an insulating film (formed of an SiO$_2$ film which is formed through a selective oxidation process and has a thickness of 1 μm) for effecting isolation between elements. The circuit programming element 501 under normal conditions is kept in a non-conductive state and therefore does not operate as an MOS transistor. When a sufficient amount of energy is given to the element 501 by the irradiation of a laser or electron beam 581, the regions 551 and 552 are extended so as to form regions 571 and 572. Then, the element 501 can operate as an MOS transistor. Experiments have shown that in the case where a spacing between the gate electrode 53 and each of the regions 551 and 552 is equal to 2 μm and the regions 551 and 552 have a depth of 0.5 μm, the element 501 can exhibit the same transistor action or characteristic as the MOS transistor 601 when the greater part of the surface of the element 501 is irradiated with a laser beam having an energy of $10^7$ W/cm$^2$ or less. Before the irradiation of the laser beam, the element 501 cannot operate as an MOS transistor even if a high voltage is applied to the gate electrode 53. Accordingly, in the case where a high voltage has been previously applied to the gate electrode 53, the regions 551 and 552 isolated from each other may be considered as being short-circuited by the irradiation of the laser beam.

Figure 13:
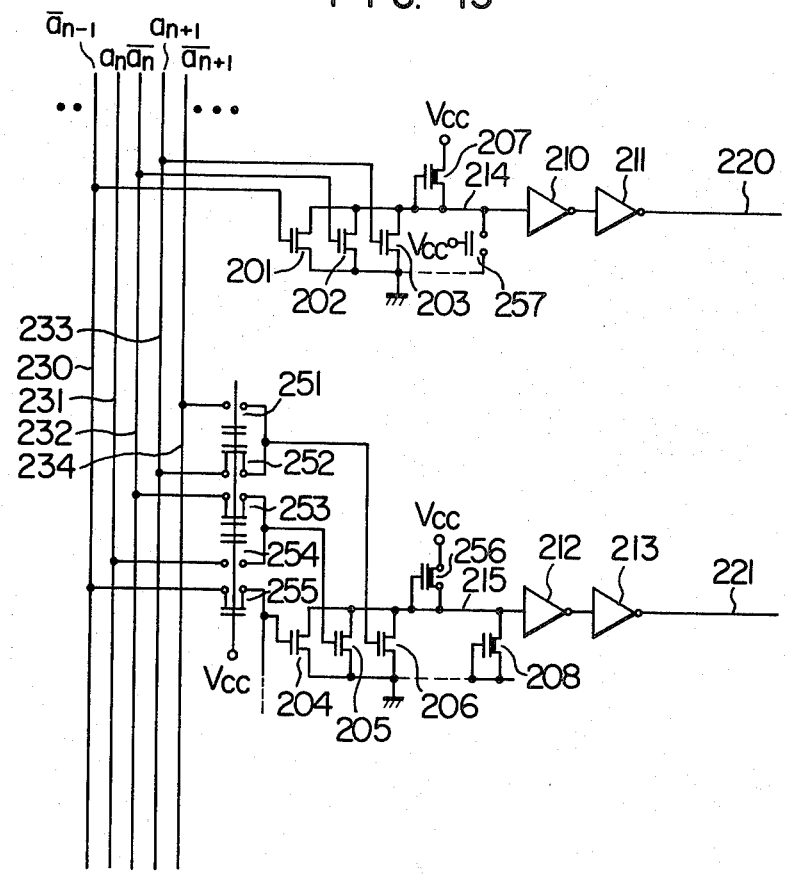
FIG. 13 is a circuit diagram showing a decoder circuit which includes circuit programming elements according to a still further embodiment of the present invention.

FIG. 13 shows a decoder circuit including the circuit programming element shown in FIG. 12, and more particularly, a programmable decoder in which a faulty bit can be replaced by a spare bit. In FIG. 13, reference symbol V$_{cc}$ designates a supply voltage input terminal, and numerals 201 to 206 denote N-channel enhancement mode MOS transistors, 207 an N-channel depletion mode MOS transistor, 210 to 213 inverters, and 251 to 257 offset-gate electrode structure elements. The inverters 210 and 211 form a driver circuit for driving a word line 220, and the inverters 212 and 213 form a driver circuit for driving a word line 221. One terminal of each of the elements 251 to 255 is connected to one of address lines 230 to 234. The other terminal of the element 251 and that of the element 252 are connected to each other and connected to the gate electrode of the MOS transistor 204, and the other terminal of the element 253 and that of the element 254 are connected to each other and connected to the gate electrode of the MOS transistor 205. Similarly, the other terminal of the element 255 and that of an element (not shown) are connected to each other and connected to the gate electrode of the MOS transistor 206. The word line 221 is a spare word line connected to spare memory cells and is kept in the low potential level by an N-channel depletion mode MOS transistor 208 when there is no faulty bit in a memory cell array. When a faulty cell is found among memory cells connected to the word line 220, the offset-gate electrode structure elements 252, 253, 255 and 256 are activated through the irradiation of laser beams in accordance with the address lines 230, 232 and 233 connected to a regular decoder which is made up of the MOS transistors 201 to 203 and 207. Then, a spare decoder (made up of the MOS transistors 204 to 206 and 208 and the offset-gate electrode structure element 256) has the same circuit configuration as the above-mentioned regular decoder. Further, when the resistance of the transistor 208 is made much greater than that of the element 256, it becomes possible to substitute the word line 221 for the word line 220. On the other hand, the output line 214 of the faulty decoder made up of the MOS transistors 201 to 203 and 207 is cut open by the irradiation of laser beams or the like and the element 257 is activated to the conductive state by the laser irradiation to keep the input of the inverter 210 in the low potential level. As described above, a faulty bit in an IC memory can be eliminated or replaced by a spare bit using an integrated circuit and a circuit programming process according to the present invention.

Figure 14:
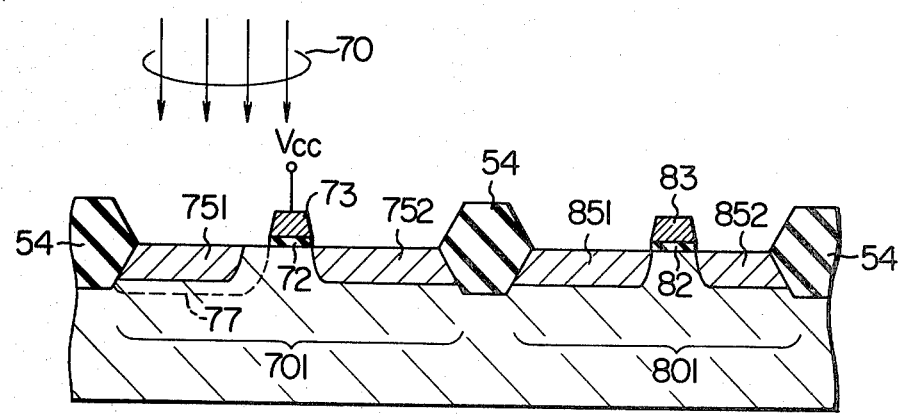
FIGS. 14, 15, 16 and 17 are sectional views showing furthermore embodiments of a circuit programming element.

FIG. 14 shows another example of the offset-gate type circuit programming element. In FIG. 14, reference numeral 801 designates an MOS transistor for forming a regular circuit, and 701 an offset-gate electrode structure element for circuit programming. The MOS transistor 801 being an ordinary MOS transistor including a gate electrode 83, a gate insulating film 82 and source and drain regions 851 and 852 is not required to have the offset-gate structure. With respect to the circuit programming element 701, on the other hand, one of the source and drain regions 751 and 752 (diffusion layer 751 in the shown example) is offset from the gate electrode 73. When the element 701 is irradiated with a laser beam 70, the region 751 is extended so as to form a region 77. As a result, the element 701 is activated, to serve as an MOS transistor similar to the transistor 801.

In the case where a voltage (for example, $V_{cc}$) higher than a threshold voltage is applied to the gate electrode 73, the element 701 is converted from a non-conductive state to a conductive state by the laser beam irradiation. Alternatively, a signal voltage may be applied to the gate electrode 73. In FIG. 14, reference numeral 51 designates a semiconductor substrate, 54 an insulating film for effecting isolation between circuit elements, and 72 an gate insulating film.

Figure 15:
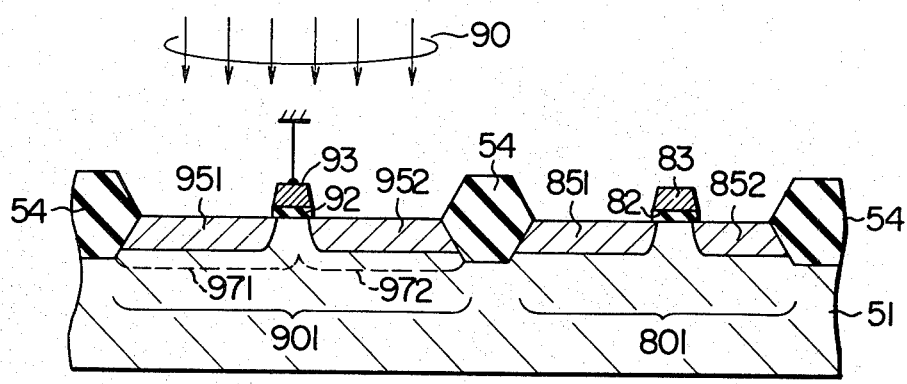

FIG. 15 shows another example of the MOS transistor type circuit programming element. Referring to FIG. 15, each of a circuit programming element 901 and an element 801 for making up a regular circuit is formed on a semiconductor substrate 51 as an ordinary MOS transistor. That is, the element 801 includes a gate electrode 83, a gate insulating film 82 and source and drain regions 851 and 852. Similarly, the element 901 includes a gate electrode 93, a gate insulating film 92 and source and drain regions 951 and 952. In the case where the circuit programming element 901 is of enhancement mode, the source and drain regions 951 and 952 are isolated from each other by connecting the gate electrode 93 to the ground. When only the circuit programming element 901 is irradiated at approximately the entire surface thereof with a laser beam 90, the source and drain regions 951 and 952 are extended to form regions 971 and 972 so that the source and drain regions are short-circuited. The circuit programming element shown in FIG. 15 is superior to those shown in FIGS. 12 and 14 in that a desired integrated circuit can be fabricated using the reduced number of photomasks.

The activation process of circuit programming element shown in FIG. 15 is also applicable to the circuit programming elements shown in FIGS. 12 and 14. In more detail, for the offset-gate electrode structure element shown in FIG. 9, the source and drain regions 551 and 552 are extended by the laser irradiation to be put in contact with each other. The short-circuit thus formed between the regions 551 and 552 can be used for circuit programming.

Though various circuit programming elements has been explained in detail, it should be noted that a desired circuit programming can be made by properly combining the circuit programming elements shown in FIGS. 12, 14 and 15.

The foregoing description has been made with respect to the case where N-channel MOS transistors are integrated on a p-type semiconductor substrate. However, the present invention is applicable to (i) where P-channel MOS transistors integrated on an n-type semiconductor substrate, (ii) a CMOS circuit including P-channel MOS transistors integrated on an n-type semiconductor substrate and N-channel MOS transistors formed in p-type wells, and (iii) a CMOS circuit formed on a p-type semiconductor substrate. Further, though the decoder made up of N-channel MOS transistors has been explained, the present invention is applicable to the case where the decoder is formed of a CMOS circuit.

Figure 16:
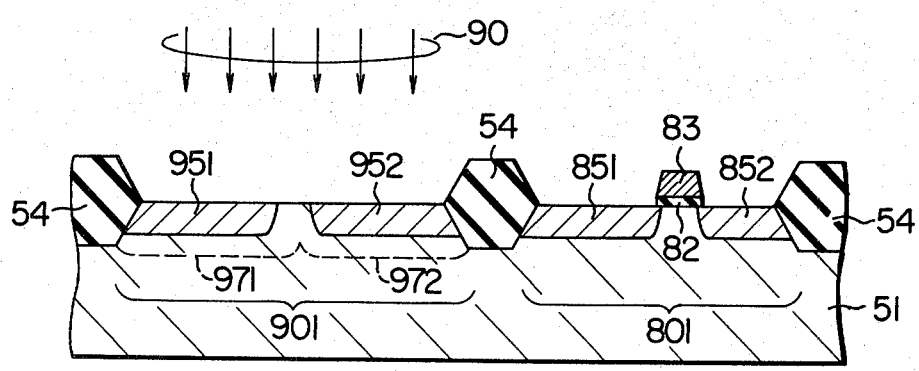
Figure 17:
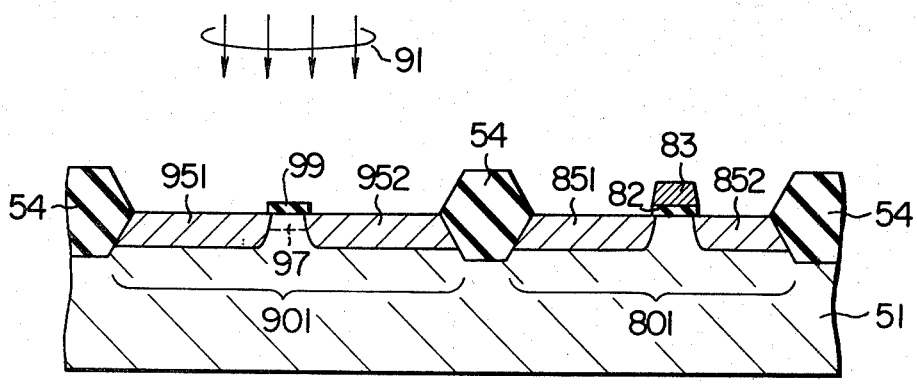

FIGS. 16 and 17 show modifications of the MOS transistor type circuit programming element. The diffusion layer type circuit programming elements shown in FIGS. 16 and 17 are obtained by removing the gate electrode 93 and the gate insulating film 92 from the MOS-transistor type circuit programming element 901 shown in FIG. 15.

In a circuit programming element 901 shown in FIG. 16, diffusion regions 951 and 952 spaced apart from each other are short-circuited by the irradiation of a laser beam 90.

In a circuit programming element 901 shown in FIG. 17, diffusion regions (for example, of n+-type) 951 and 952 spaced apart from each other are short-circuited by a region 97 which is formed by impurity diffusion due to the irradiation of a laser beam 91 from an insulating film 99 (for example, a phosphosilicate glass film) doped with an n-type impurity.

All of the above-mentioned circuit programming elements have been activated by the irradiation of laser beams for the conversion into conductive or conductable elements, i.e. the formation of an interconnection (FIGS. 2A, 2C, 15, 16 and 17) or for the formation of connection circuit using conductive or conductable elements (FIGS. 6A, 11, 12 and 14). However, the activation of the circuit programming elements may be also effected by an ion-implantation process in such a manner that the laser beams 10, 18, 581, 582, 70, 90 and 91 are replaced by ion beams.

When ion beams are employed, in the elements shown in FIGS. 2A, 2C and 6A, the high-resistance region is converted into a low-resistance region. The circuit programming elements shown in FIGS. 11, 12 and 14, are converted into the structure shown in FIG. 10. In the circuit programming element shown in FIG. 15, a conductive channel of a conductivity type (opposite to that of the substrate 51) is formed in a surface region of the substrate beneath the gate electrode so that the enhancement mode MOS transistor 901 is converted into a depletion mode MOS transistor. In the circuit programming elements shown in FIGS. 16 and 17, the regions 951 and 952 are connected to each other through an ion-implanted region formed in a surface region of the substrate 51.

As is apparent from the foregoing description, the present invention provides a high degree of freedom and a high reliability for circuit programming of a semiconductor integrated circuit. Accordingly, it is possible to carry out the formation of a logical intergrated circuit using the master slice approach, the automatic programming of a microcomputer, and the substitution of a spare memory bit for a defective bit, by fabricating standard chips without additional silicon process steps and applying a circuit programming process of the present invention to the fabricated chips or wafers. Thus, the present invention is suitable for many uses in digital integrated circuits. The present invention is also applicable to analog circuits. For example, in the case where the present invention is utilized for the examination of an analog amplifier or the like, a desired test can be facilitated in such a manner that a feedback loop is closed after a test has been made in a state that the feedback loop is disconnected. The present invention is widely applicable to analog integrated circuits, for example, for the application of an input offset voltage to an analog amplifier and the trimming of a D-A converter.

We claim:

1. A programmable semiconductor integrated circuit including in a semiconductor substrate a regular circuit, a spare circuit, and at least one circuit programming element which has a first terminal connected to the regular circuit and a second terminal connected to the spare circuit and which, when at least a part of the regular circuit is defective, is characterized by being convertible from its original nonconductive state to a conductive state so that the defective part of the regular circuit is replaced by the spare circuit through the conversion of the circuit programming element, wherein said circuit programming element comprises a semiconductor element including two spaced low-resistance portions as said first and second terminals laterally provided on an insulating layer disposed on said semiconductor substrate and an intermediate high-resistance portion disposed adjacent to and between said low-resistance portions and electrically coupled to said low-resistance portions.

2. A programmable semiconductor integrated circuit according to claim 1, wherein the low-resistance portions of said programming semiconductor element are doped with impurities of the same conductivity type.

3. A programmable semiconductor integrated circuit according to claim 1, wherein the low-resistance portions of said programming semiconductor element are doped with impurities of different conductivity types, respectively.

4. A programmable semiconductor integrated circuit according to claim 2, wherein the high-resistance portion of said programming semiconductor element is made of an intrinsic semiconductor material.

5. A programmable semiconductor integrated circuit according to claim 3, wherein the high-resistance portion of said programming semiconductor element is made of an intrinsic semiconductor material.

6. A programmable semiconductor integrated circuit according to claim 2, wherein the high-resistance portion of said programming semiconductor element is lightly doped with impurity of the same conductivity type as one of said low-resistance portions.

7. A programmable semiconductor integrated circuit according to claim 3, wherein the high-resistance portion of said programming semiconductor element is lightly doped with impurity of the same conductivity type as one of said low-resistance portions.

8. A programmable semiconductor integrated circuit according to claim 4, wherein said programming semiconductor element has an insulating film provided on at least a part of said high-resistance portion, said insulating film being doped with impurity of the same conductivity type as one of said low-resistance portions.

9. A programmable semiconductor integrated circuit according to claim 5, wherein said programming semiconductor element has an insulating film provided on at least a part of said high-resistance portion, said insulating film being doped with impurity of the same conductivity type as one of said low-resistance portions.

10. A programmable semiconductor integrated circuit according to claim 6, wherein said programming semiconductor element has an insulating film provided on at least a part of said high-resistance portion, said insulating film being doped with impurity of the same conductivity type as one of said low-resistance portions.

11. A programmable semiconductor integrated circuit according to claim 7, wherein said programming semiconductor element has an insulating film provided on at least a part of said high-resistance portion, said insulating film being doped with impurity of the same conductivity type as one of said low-resistance portions.

12. A programmable semiconductor integrated circuit according to claim 8, wherein at least one undoped insulating film is interposed between said high-resistance portion and said doped insulating film.

13. A programmable semiconductor integrated circuit according to claim 9, wherein at least one undoped insulating film is interposed between said high-resistance portion and said doped insulating film.

14. A programmable semiconductor integrated circuit according to claim 10, wherein at least one undoped insulating film is interposed between said high-resistance portion and said doped insulating film.

15. A programmable semiconductor integrated circuit according to claim 11, wherein at least one undoped insulating film is interposed between said high-resistance portion and said doped insulating film.

16. A programmable semiconductor integrated circuit including in a semiconductor substrate a regular circuit, a spare circuit, and at least one circuit programming element which has a first terminal connected to the regular circuit and a second terminal connected to the spare circuit and which, when at least a part of the regular circuit is defective, is characterized by being convertible from its original nonconductive state to a conductive state so that the defective part of the regular circuit is replaced by the spare circuit through the conversion of the circuit programming element, wherein said circuit programming element comprises a semiconductor element including two spaced diffusion regions as said first and second terminals of a first conductivity type provided in a surface region of said semiconductor substrate of a second conductivity type with an intermediate surface region portion existing therebetween.

17. A programmable semiconductor integrated circuit according to claim 16, wherein said programmable semiconductor element has an insulated-gate transistor structure including a gate electrode, for receiving a gate potential, provided through an insulating film on said intermediate surface region portion, said spaced diffusion regions being provided as source and drain regions, respectively.

18. A programmable semiconductor integrated circuit according to claim 17, wherein at least one of said source and drain regions is offset from said gate electrode.

19. A programmable semiconductor integrated circuit according to claim 17, wherein said gate electrode overlaps each of said source and drain regions.

20. A programmable semiconductor integrated circuitry according to claim 16, wherein said programming semiconductor element has an insulating film provided on said intermediate surface region portion, said insulating film being doped with impurity of said first conductivity type.

21. A programmable semiconductor integrated circuit according to claim 1, wherein said regular circuit includes regular column and/or row parts while said spare circuit includes spare column and/or row parts, and a defective portion of said regular column and/or row part can be replaced by said spare column and/or row part through the conversion of said programming semiconductor element.

22. A programmable semiconductor integrated circuit according to claim 21, wherein said regular circuit includes regular decoders while said spare circuit includes spare decoders, and one of said regular decoders in said defective regular column and/or row part is replaced by one of said spare decoders.

23. A programmable semiconductor integrated circuit according to claim 16, wherein said regular circuit includes regular column and/or row parts while said spare circuit includes spare column and/or row parts, and a defective portion of said regular column and/or row part can be replaced by said spare column and/or row part through the conversion of said programming semiconductor element.

24. A programmable semiconductor integrated circuit according to claim 23, wherein said regular circuit includes regular decoders while said spare circuit includes spare decoders, and one of said regular decoders in said defective regular column and/or row part is replaced by one of said spare decoders.

25. A programmable semiconductor integrated circuit according to claim 22, wherein each of said decoders includes a word line connected to a memory cell, and wherein a plurality of second circuit programming elements are associated with the respective word lines in said regular decoders, each of said second programming elements being characterized by being convertible from its original nonconductive state to a conductive state when the memory cell connected to the associated word line is defective so that the word line is made inoperative, each of said second programming elements comprising a semiconductor element including two opposite spaced low-resistance portions as first and second terminals laterally provided on an insulating layer disposed on said semiconductor substrate and an intermediate high-resistance portion disposed adjacent to and between said low-resistance portions and electrically coupled to said low-resistance portions, the first terminal of the second programming element being coupled to the associated word line while the second terminal thereof is connected to a predetermined potential for rendering the word line inoperative through the conversion of the second programming element.

26. A programmable semiconductor integrated circuit according to claim 24, wherein each of said decoders includes a word line connected to a memory cell, and wherein a plurality of second circuit programming elements are associated with the respective word lines in said regular decoders, each of said second programming elements being characterized by being convertible from its original nonconductive state to a conductive state when the memory cell connected to the associated word line is defective so that the word line is made inoperative, each of said second programming elements comprising an insulated-gate transistor structure including two spaced source and drain regions as first and second terminals of a first conductivity type provided in a surface region of said semiconductor substrate of a second conductivity type, an intermediate surface region portion existing therebetween, and a gate electrode provided through an insulating film on said intermediate surface region portion, the first and second terminals of the second programming element being coupled to predetermined portions of the associated word line respectively while the gate electrode thereof is connected to a predetermined potential for rendering the word line inoperative through the conversion of the second programming element.

27. A programmable semiconductor integrated circuit comprising a plurality of circuit programming elements each of which has first and second terminals coupled to respective circuits formed in a semiconductor substrate, each of said circuit programming elements being characterized by being convertible from its original nonconductive state to a conductive state so that a required circuit programming is effected through the conversion of predetermined ones of said circuit programming elements, wherein each of said circuit programming elements comprises a semiconductor element including two spaced low-resistance portions as said first and second terminals laterally provided on an insulating layer disposed on said semiconductor substrate and an intermediate high-resistance portion disposed adjacent to and between said low-resistance portions and electrically coupled to said low-resistance portions.

28. A programmable semiconductor integrated circuit according to claim 27, wherein the low-resistance portions of said programming element are doped with impurities of different conductivity types, respectively, and said programming element provides a pn junction element when it is converted from the original nonconductive state to the conductive state.

29. A programmable semiconductor integrated circuit according to claim 28, wherein said respective circuits formed in said substrate include a plurality of word lines and a plurality of data lines which are arranged in a matrix form, and one of the first and second terminals of said programming element is connected to the word line at each intersection of the word and data lines while the other terminal is connected to the data line at the intersection of the word and data lines, whereby the conversion of said predetermined programming elements provides a programmable logic array.

30. A programmable semiconductor integrated circuit comprising:
first and second predetermined circuits; and
a circuit programming element coupled to said first and second predetermined circuits and which is characterized in being convertible from its original nonconductive state to a conductive state to provide electrical connection between said first and second predetermined circuits to effect circuit programming,
wherein said circuit programming element is an insulated-gate electrode structure element including source and drain regions of a first conductivity type provided in a surface region of a semiconductor substrate of a second conductivity type and a gate electrode, for receiving a gate potential, provided through an insulating film on a portion of said surface region existing between said source and drain regions, and said source and drain regions are to be extended to activate said insulated-gate electrode structure element.

31. A programmable semiconductor integrated circuit comprising:
first and second predetermined circuits; and
a circuit programming element coupled to said first and second predetermined circuits and which is characterized in being convertible from its original nonconductive state to a conductive state to provide electrical connection between said first and second predetermined circuits to effect circuit programming,
wherein said circuit programming element is an insulated-gate electrode structure element including source and drain regions of a first conductivity type provided in a surface region of a semiconductor substrate of a second conductivity type and a gate electrode, for receiving a gate potential, provided through an insulating film on a portion of said surface region existing between said source and drain regions, and wherein at least one of said source and drain regions is to be extended to activate said insulated-gate electrode structure element.

32. A programmable semiconductor integrated circuit according to claim 1, wherein said circuit programming element is characterized by being convertible from its original nonconductive state to a conductive state in response to laser radiation having a predetermined intensity for diffusing impurities from said low-resistance portions into said high-resistance portion to reduce the resistance of said high-resistance portion to thereby convert said circuit programming element to its conductive state.

33. A programmable semiconductor integrated circuit according to claim 8, wherein said circuit programming element is characterized by being convertible from its original nonconductive state to a conductive state in response to laser radiation having a predetermined intensity for diffusing impurities from said insulating film into said high-resistance portion to reduce the resistance of said high-resistance portion to thereby convert said circuit programming element to its conductive state.

34. A programmable semiconductor integrated circuit according to claim 1, wherein said circuit programming element is characterized by being convertible from its original nonconductive state to a conductive state in response to ion implantation radiation having a predetermined intensity to dope said high-resistance portion to reduce its resistance to thereby convert said circuit programming element to its conductive state.

35. A programmable semiconductor integrated circuit according to claim 27, wherein said circuit programming element is characterized by being convertible from its original nonconductive state to a conductive state in response to laser radiation having a predetermined intensity for diffusing impurities from said low-resistance portions into said high-resistance portion to reduce the resistance of said high-resistance portion to thereby convert said circuit programming element to its conductive state.

36. A programmable semiconductor integrated circuit according to claim 27, wherein said circuit programming element is characterized by being convertible from its original nonconductive state to a conductive state in response to laser radiation having a predetermined intensity for diffusing impurities from said insulating film into said high-resistance portion to reduce the resistance of said high-resistance portion to thereby convert said circuit programming element into its conductive state.

37. A programmable semiconductor integrated circuit according to claim 27, wherein said circuit programming element is characterized by being convertible from its original nonconductive state to a conductive state in response to ion implantation radiation having a predetermined intensity to dope said high-resistance portion to reduce its resistance to thereby convert said circuit programming element to its conductive state.

* * * * *

UNITED STATES PATENT AND TRADEMARK OFFICE
CERTIFICATE OF CORRECTION

PATENT NO. : 4,455,495

DATED : June 19, 1984

INVENTOR(S) : Masuhara et al

It is certified that error appears in the above-identified patent and that said Letters Patent is hereby corrected as shown below:

On the title page under "Foreign Application Priority Data", insert the following:

--Aug. 20, 1980 [JP]   Japan..........55-113512--

Signed and Sealed this

Thirteenth Day of August 1985

[SEAL]

Attest:

DONALD J. QUIGG

Attesting Officer   Acting Commissioner of Patents and Trademarks